(12) United States Patent
Williams

(10) Patent No.: US 7,288,125 B1
(45) Date of Patent: Oct. 30, 2007

(54) CRYSTAL GROWING KIT AND METHOD

(76) Inventor: Ron Williams, 14755 E. 99th St. North, Owasso, OK (US) 74055

( * ) Notice: Subject to any disclaimer, the term of this patent is extended or adjusted under 35 U.S.C. 154(b) by 355 days.

(21) Appl. No.: 10/980,761

(22) Filed: Nov. 3, 2004

(51) Int. Cl.
  *C30B 29/04* (2006.01)
(52) U.S. Cl. .................. 23/295 R; 422/245.1
(58) Field of Classification Search ............. 422/245.1; 23/295 R
  See application file for complete search history.

(56) References Cited

U.S. PATENT DOCUMENTS

| | | | |
|---|---|---|---|
| 4,944,925 A | 7/1990 | Yamauchi et al. | |
| 5,375,556 A | 12/1994 | Krempl et al. | |
| 5,431,124 A | 7/1995 | Machida et al. | |
| 5,690,731 A | 11/1997 | Kurata et al. | |
| 6,048,396 A | 4/2000 | Yanagisawa et al. | |
| 6,468,347 B1 | 10/2002 | Motoki et al. | |
| 6,491,753 B2 | 12/2002 | Krempl et al. | |
| 6,562,131 B2 | 5/2003 | Vodakov et al. | |
| 6,586,316 B2 | 7/2003 | Tsuda et al. | |
| 6,670,282 B2 | 12/2003 | Kuriyama et al. | |

OTHER PUBLICATIONS

About chemistry, http://chemistry.about.com/cs/homeexperiments/gr/aapr111002.htm Dec. 20, 2006 reviewed Mar. 2004.*

* cited by examiner

*Primary Examiner*—Robert Kunemund
(74) *Attorney, Agent, or Firm*—Molly D. McKay

(57) ABSTRACT

A kit and method for growing crystals for educational purposes. The kit consists of a small plastic petri dish, and a paper substrate with short and long slits precut therein that act as seed, respectively, for the formation of single and multiply crystals. The disk of paper has a tab that serves as a handle for placing and removing the disk from the petri dish and as a place to write on the disk. The kit is used by pouring a saturated aqueous salt solution in the bottom of the petri dish and then floating the substrate on the top of the solution. The dish is then allowed to sit uncovered for several days and crystals grow on the bottom surface of the substrate as the liquid evaporates.

8 Claims, 1 Drawing Sheet

CRYSTAL GROWING KIT AND METHOD

BACKGROUND OF THE INVENTION

1. Field of the Invention

The present invention relates to a crystal growing kit and method of growing crystals for educational purposes.

2. Description of the Related Art

Elementary or secondary education science curriculums often include a lab project where the students grow crystals. The current method of growing crystals from a saturated salt solution involves first mixing up a saturated solution of a salt in a deep container, such as a pint jar. Next, a piece of string with a paper clip attached to one end is suspended from the mouth of the container by tying the other end of the string to a pencil. The pencil is laid horizontally across the top or mouth of the jar so that the string and paper clip are suspended from the pencil and hang downward into the saturated salt solution. The string and or the paper clip then serve as substrate on which crystals grow as the liquid evaporates from the salt solution.

One of the problems with this current method of growing crystals is that crystal growth using this method is not predicable and sometimes crystals will not grow on the string or on the paper clip. Even if crystals do grow on the substrate, they are often not as large and perfectly grown as is desired.

Another problem with the present method is that the pencil that is used to hold the string and paper clip can roll or slip off the mouth of the container and thereby ruin the crystal growth.

Still another problem with the present method is that a large volume of liquid is needed to fill the deep jar sufficiently, making it expensive to have more than one jar available in a classroom. Thus, this method of growing crystals normally is done by the teacher as a demonstration rather than as a project that each individual student is able to do on their own.

Another problem with the present method is that it takes from four to six weeks to grow crystals.

Still a further problem with the present invention is that when crystals grow on the substrate, the crystals generally grow as multiple crystals, and production of the more desirable single crystals is rare. The single crystals are more desirable because they are easier to examine than multiple crystals.

Finally, even if perfect crystals are grown, the string is flexible and this makes it hard to handle the crystals without damaging or dislodging them from the substrate. For this reason, long term storage of the crystals that are grown on string is difficult since there is no flat surface on the substrate to which the crystals are attached and on which the substrate can rest during storage.

The present invention addresses these problems by providing a cost effective kit and method for reliably growing crystals in the classroom. The kit consists of only a disposable plastic petri dish and a piece of construction paper, making it very inexpensive. Further, the present invention is designed so that both single and multiple crystals are grown on each substrate. The crystals that are grown using the present kit and method are larger and more perfect than those normally produced by prior art classroom crystal growing methods. Because the crystals are grown on a flat substrate and within a clear petri dish, the dish and the substrate are easy to handle, and it is hard to ruin the growing crystals. Because the kit employs 25 milliliter petri dishes, the volume of saturated salt solution needed per each petri dish or student is small, thereby making it economical enough so that each student can grow his or her own crystals.

The present kit and method produces both multiple and single crystals in less than five days on each substrate so that the students can see the difference between these two types of crystalline growth and can have single crystals to examine. The construction paper substrate used in the present kits and method for the substrate on which crystal growth occurs is sufficiently strong, even when still wet, to support the crystals that grow on it so that students can handle the substrate and crystals without dislodging the crystals from the substrate. Because the substrate is strong, this allows the crystals to be stored without damage for long periods of time, for example until the next year so that the crystals can be shown to a new class of students.

SUMMARY OF THE INVENTION

The present invention is a kit and method for growing crystals in the classroom environment for educational purposes. The kit consists of a small petri dish, and a precut paper substrate that acts as a seed for crystal formation. Sufficient salt and water are needed to create a saturated aqueous salt solution that is used with the kit.

A saturated aqueous solution of the salt is made by traditional methods. The bottom half of a 25 milliliter plastic petri dish is filled at least half full with the freshly prepared saturated salt solution while the solution is still warm. A precut paper disk substrate is then placed on the liquid in the dish. The disk of paper has a tab that serves as a handle for placing and removing the disk from the petri dish. As the solution cools, the saturated salt solution becomes supersaturated. In use, the tab is bent upward at a right angle from the rest of the disk. Crystals grow on the bottom surface of the paper disk at the perforated slits provided in the paper disk as the liquid evaporates from the salt solution. Normally, it takes approximately 1-3 days for the crystals to grow, depending on the type of salt that is employed. The disk of paper is perforated with shorter slits on the half of the disk where the handle is located and with longer slits provided on the half of the disk opposite the handle. The shorter slits serve to promote growth of single crystals whereas the longer slits promote multiple crystal growth.

Once crystal growth is complete, the wet disk and the attached crystals are removed from the petri dish by grasping the handle and lifting the disk upward. The wet disk should be inverted with the crystals upright and allowed to dry for a few hours. The dry crystals can then be examined by the students or stored for long periods in a plastic container.

DETAILED DESCRIPTION OF THE PREFERRED EMBODIMENT THE INVENTION

Figure 1:
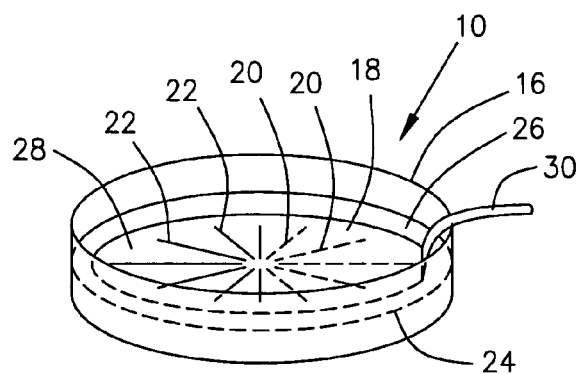
FIG. 1 is a perspective view of a crystal growing kit constructed in accordance with a preferred embodiment of the present invention.
Figure 2:
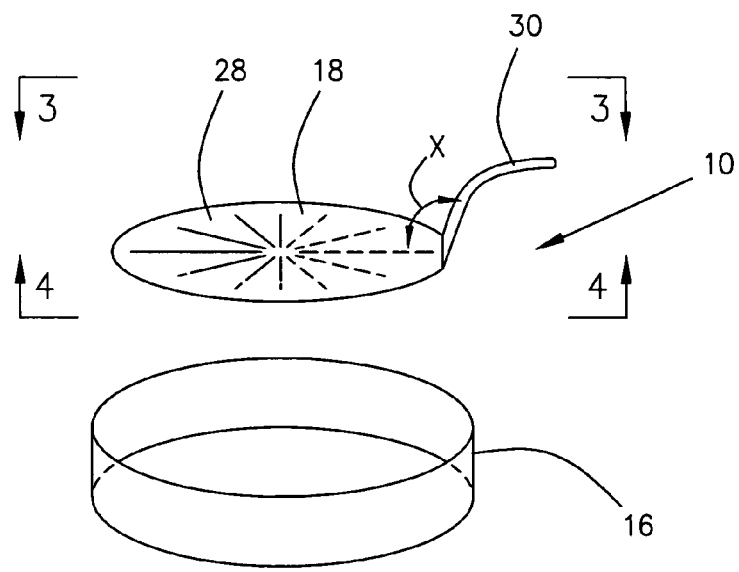
FIG. 2 is an exploded view of the crystal growing kit shown in FIG. 1.

Referring now to the drawings and initially to FIGS. 1 and 2, there is illustrated a kit 10 and method for growing single and multiple crystals 12 and 14 in a classroom environment for educational purposes according to a preferred embodiment of the present invention. The kit 10 consists of a small petri dish 16, a substrate or paper disk 18 with precut short and long slits 20 and 22 that act as seed, respectively, for forming single and multiple crystals 12 and 14. Also, sufficient salt and water (both not illustrated) are needed to create a saturated aqueous salt solution 24 that will be used in conjunction with the kit 10.

Although any size and type of petri dish can be employed in the present invention, use of a 25 milliliter plastic petri dish 16 is most economical because it is inexpensive, reusable and disposable and does not require the use of as much saturated salt solution to fill the dish 16 at least half full as would be required if a larger dish were used. The depth of the solution or liquid 24 is not critical to the growth of the crystals 12 and 14, and the petri dish 16 can be filled from between half full to completely full with saturated salt solution 24. If the petri dish 16 is not at least approximately half full, there may not be enough salt in the solution 24 for effective crystal growth. Also, the liquid 24 might spill out and cause a mess as the disk 18 is placed on the surface 26 of the liquid 24 if the petri dish 16 is completely filled with saturated salt solution 24.

The precut substrate 18 is a disk of paper having a circular perforated portion 28 and a tab 30 extending outward from the perforated portion 28 so that the tab 30 serves as a handle for the substrate 18. In use, the tab 30 is bent upward at a right angle, as illustrated in FIG. 2, from the perforated portion 28 of the disk 18. The tab 30 is held by the users as the disk 18 is lowered onto the top surface 26 of the saturated salt solution 24 that was previously poured into the petri dish 16, and the tab 30 remains in an upwardly extending position above the surface 26 of the salt solution 24, as shown in FIG. 1, while the crystals 12 and 14 grow on a bottom surface 32 of the substrate 18. Normally, it takes approximately 1-3 days for the crystals 12 and 14 to grow, depending on the type of salt that is employed. The tab 30 is also used to lift the disk 18 out of the petri dish 16 when crystal growth is completed.

Figure 3:
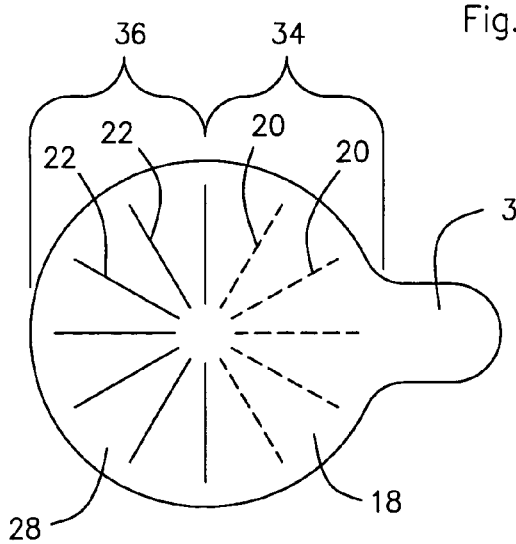
FIG. 3 is a top plan view of the paper substrate taken along line 3-3 of FIG. 2.
Figure 4:
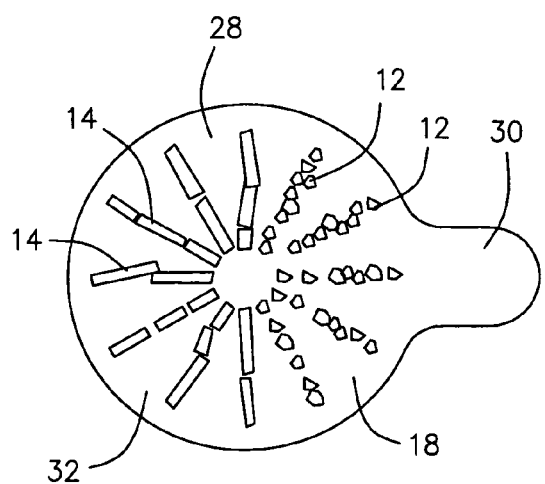
FIG. 4 is a bottom plan view of the paper substrate taken along line 4-4 of FIG. 2 and showing the single and multiple crystals that grow on the bottom surface of the substrate.

Referring to FIG. 3, the disk of paper 18 is perforated so that the shorter slits 20 are located in a first half 34 of the disk 18 located adjacent to the tab 30 and the longer slits 22 are located in a second half 36 of the disk 18 located opposite the tab 30. As shown in FIG. 4, the shorter slits 20 serve to promote growth of single crystals 12, whereas the longer slits 22 promote growth of multiple crystals 14. The longer slits 22 are provided on the second half 36 of the disk and opposite the handle 30 because the multiple crystals 14 are heavier than the single crystals 12. By having the heavier multiple crystals 14 located at the second half 36 which forms the lower end of the disk 18 as the disk 18 is lifted upward from the petri dish 16 via the handle 30, there is less stress on the disk 18 with the heaviest crystals 14 hanging downward from the lower end of the disk 18. This makes it less likely that the disk 18 will tear under the weight of the crystals 12 and 14 even when the disk 18 is still wet from the liquid 24.

The substrate 18 is preferably constructed from 24 pound construction paper. Although the substrate 18 can be made from colored construction paper so that the crystals 12 and 14 that grow on the substrate 18 will be more easily seen, the color of the construction paper does not affect the growth or the color of the crystals 12 and 14 that are grown on the substrate 18.

The salt used in creating the saturated salt solution 24 may be any type of salt commonly used for growing crystals 12 and 14 in a classroom. These salts can include, but are not limited to, copper sulfate, rock salt, and Epson salts.

In order to grow crystals 12 and 14 according to the present method, a saturated salt solution 14 is freshly produced from the desired salt according to standard methods. The normal procedure for creating a saturated salt solution 14 is to fill a 250 milliliter beaker about half full of hot water and add 4 heaping teaspoonfuls of the desired salt, stirring until most of the salt dissolves. If all of the salt dissolves, salt should be added a teaspoonful at a time and the solution stirred until undissolved-salt remains at the bottom of the beaker. This makes enough solution 14 for use in about nine of the 25 milliliter petri dishes 16. While the freshly prepared saturated salt solution 14 is still warm, it is then poured into the bottom halves of the plastic petri dishes 16 so as to fill the petri dishes 16 slightly over half full.

Next, the tabs 30 on the disks 18 are bent so that the tabs extend at right angles, as illustrated by angle X in FIG. 2, to the perforated portion 28 of the disk 18. Students can use the tabs 30 as a place to write their names, the date, the salt employed, etc. The tab 30 of each disk is grasped as the perforated portion 28 is placed on top the liquid 24 in the associated petri dish 16 so that the disk 18 floats on the surface 26 of the liquid 24.

The petri dish 16 is then placed on a flat surface where it will remain undisturbed as the crystals 12 and 14 grow on the bottom surface 32 of the perforated portion 28 of the disk 18. Crystal growth can be monitored by holding the dish 16 up to a light source. However, the paper disk 18 should not be removed from the liquid 24 until crystal growth is complete as removing the disk 18 from the solution 24 will stop the growth of the crystals 12 and 14.

Once crystal growth is complete, the wet disk 18 is removed from the petri dish 16 by grasping the tab 30 and lifting the disk 18 upward. The wet disk 18 should be inverted with the crystals 12 and 14 resting upright in order for the crystals 12 and 14 to dry. Most types of crystals 12 and 14 dry in a few hours. Once dry, the crystals 12 and 14 can be examined by the students. Also, the crystals 12 and 14 will last for years if stored in a plastic bag or container. If desired, the plastic petri dish in which the crystals 12 and 14 were grown can be cleaned and dried so that it can be used as a container to store the crystals 12 and 14.

While the invention has been described with a certain degree of particularity, it is manifest that many changes may be made in the details of construction and the arrangement of components without departing from the spirit and scope of this disclosure. It is understood that the invention is not limited to the embodiments set forth herein for the purposes of exemplification, but is to be limited only by the scope of the attached claim or claims, including the full range of equivalency to which each element thereof is entitled.

What is claimed is:

1. A crystal growing kit comprising:
a flat container for receiving a saturated aqueous salt solution, a circular shaped perforated piece of paper approximately the size of the flat container so that the piece of paper floats on the salt solution initially with its edges close to the sides of the container and seals to the sides of the container as the solution evaporates, said piece of paper provided with two different lengths of slits extending through it which serve as seeds for the growth of crystals as the salt solution evaporates from the container.

2. A crystal growing kit according to claim 1 wherein said piece of paper is provided with small slits extending through a first half of the piece of paper for growth of single crystals and provided with longer slits extending through an opposite second half of the piece of paper for growth of multiple crystals.

3. A crystal growing kit according to claim 2 further comprising:
a tab provided on the piece of paper that serves as a handle for lifting and holding the piece of paper and serves as a place to write information.

4. A crystal growing kit according to claim 3 wherein the container is a petri dish.

5. A method for growing crystals comprising:
filling a petri dish at least partially full with a warm and freshly prepared saturated aqueous salt solution,
placing a circular shaped perforated substrate that has both short slits for growing single crystals and long slits for growing multiple crystals provided extending through the substrate into the petri dish so that the perforated substrate floats on the surface of the salt solution so that the edges of the substrate are close to the walls of the container and seal thereto as the salt solution evaporates,
allowing crystals to form of the bottom of the substrate as the salt solution evaporates.

6. A method for growing crystals according to claim 5 further comprising the following step that precedes the steps listed in claim 5:
preparing a saturated aqueous salt solution.

7. A method for growing crystals according to claim 6 further comprising the following step that follows the step listed in claim 6 and precedes the steps listed in claim 5:
writing information on a tab that is provided on the circular shaped perforated substrate as a handle for grasping the substrate and bending the tab upward at a right angle so that the tab extends above the salt solution when the substrate is placed in the petri dish.

8. A method for growing crystals according to claim 5 further comprising the following steps that follow the steps listed in claim 5:
removing the substrate and its associated crystals from the petri dish,
inverting the substrate so that its associated crystals are facing upward, and
allowing the crystals to dry.

* * * * *